US012777633B2

(12) United States Patent
Lee et al.

(10) Patent No.: US 12,777,633 B2
(45) Date of Patent: Oct. 27, 2026

(54) SEMICONDUCTOR DEVICES

(71) Applicant: Samsung Electronics Co., Ltd., Suwon-si (KR)

(72) Inventors: Sunyoung Lee, Yongin-si (KR); Sohyeon Bae, Seoul (KR); Wonchul Lee, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1135 days.

(21) Appl. No.: 17/868,126

(22) Filed: Jul. 19, 2022

(65) Prior Publication Data

US 2023/0133763 A1 May 4, 2023

(30) Foreign Application Priority Data

Nov. 1, 2021 (KR) ........................ 10-2021-0147720

(51) Int. Cl.
*H10B 12/00* (2023.01)

(52) U.S. Cl.
CPC ........... *H10B 12/34* (2023.02); *H10B 12/315* (2023.02); *H10B 12/50* (2023.02)

(58) Field of Classification Search
CPC .... H10B 12/053; H10B 12/09; H10B 12/315; H10B 12/34; H10B 12/488; H10B 12/50
See application file for complete search history.

(56) References Cited

U.S. PATENT DOCUMENTS 10,461,153 B2 10/2019 Lee et al.
10,796,950 B2 10/2020 Lee et al.
10,818,671 B2 10/2020 Lee et al.
10,903,215 B2 1/2021 Nagai
2016/0181143 A1 6/2016 Kwon et al.
2017/0005097 A1 1/2017 Kim et al.
2018/0000764 A1 1/2018 Hernández Miramontes et al.
2019/0206877 A1* 7/2019 Kim ......................... G11C 8/14
2019/0355728 A1* 11/2019 Kim ....................... H10B 12/50
2021/0126098 A1 4/2021 Lee et al.
2023/0363148 A1* 11/2023 Munetaka ............ H10B 12/315

FOREIGN PATENT DOCUMENTS

KR 10-2019-0083164 A 7/2019
KR 10-2021-0048694 A 5/2021

* cited by examiner

*Primary Examiner* — Meiya Li
(74) *Attorney, Agent, or Firm* — Wolf, Greenfield & Sacks, P.C.

(57) ABSTRACT

A semiconductor device includes a substrate having a cell array region, a peripheral circuit region, and a connection region, a device separation region including a first device separation layer defining a cell active region on the cell array region, a second device separation layer defining a peripheral active region on the peripheral circuit region, and a third device separation layer defining an active dam on the connection region, a gate structure including a gate electrode crossing the cell active region on the cell array region, extending into the third device separation layer on the connection region, and having an end surface in the third device separation layer, and a gate contact plug electrically connected to the gate electrode on the connection region, wherein the third device separation layer includes a first insulating liner, a second insulating liner on the first insulating liner, and an embedded insulating layer.

11 Claims, 18 Drawing Sheets

A

SEMICONDUCTOR DEVICES

CROSS-REFERENCE TO RELATED APPLICATION(S)

This application claims the benefit of priority to Korean Patent Application No. 10-2021-0147720 filed on Nov. 1, 2021 in the Korean Intellectual Property Office, the disclosure of which is incorporated herein by reference in its entirety.

BACKGROUND

The present disclosure relates to semiconductor devices. According to the development of the electronics industry and the demands of users, electronic devices have been miniaturized and have been implemented with higher performance. Accordingly, demand may be high for semiconductor devices used in electronic devices to also be highly integrated and have high performance. In order to manufacture a highly scaled semiconductor device, contact technologies for stably connecting conductive structures, while reducing/minimizing resistance between adjacent conductive structures, may be demanded.

SUMMARY

An aspect of the present inventive concept is to provide a semiconductor device having improved electrical characteristics and reliability.

According to an aspect of the present inventive concept, a semiconductor device includes: a substrate having a cell array region, a peripheral circuit region, and a connection region between the cell array region and the peripheral circuit region; a device separation region including a first device separation layer defining a cell active region on the cell array region, a second device separation layer defining a peripheral active region on the peripheral circuit region, and a third device separation layer defining an active dam on the connection region, on the substrate; a gate structure including a gate electrode crossing the cell active region on the cell array region, extending into the third device separation layer on the connection region, and having an end surface in the third device separation layer; and a gate contact plug electrically connected to the gate electrode on the connection region, wherein the third device separation layer includes a first insulating liner, a second insulating liner on the first insulating liner, and an embedded insulating layer on the second insulating liner, and the gate contact plug includes a protrusion extending downwardly along the end surface of the gate electrode between the end surface of the gate electrode and the second insulating liner.

According to another aspect of the present inventive concept, a semiconductor device includes: a device separation region defining a cell active region on a substrate; a gate electrode crossing the cell active region and extending into the device separation region; and a gate contact plug electrically connected to the gate electrode, wherein the gate electrode includes a lower pattern and an upper pattern on the lower pattern, the gate contact plug includes a first contact portion and a second contact portion, the first contact portion includes an overlapping portion in contact with a side surface of the upper pattern and overlapping the lower pattern and a protrusion extending laterally from the overlapping portion to be vertically overlapped by a lower surface of the upper pattern, and the second contact portion does not vertically overlap the gate electrode.

According to another aspect of the present inventive concept, a semiconductor device includes: a device separation region defining a cell active region on a substrate; a gate electrode crossing the cell active region and extending into the device separation region; and a gate contact plug electrically connected to the gate electrode, wherein a device separation layer of the device separation region includes a first insulating liner, a second insulating liner on the first insulating liner, and an embedded insulating layer on the second insulating liner, and the gate contact plug is in contact with at least one of the first insulating liner, the second insulating liner, or the embedded insulating layer and is in contact with an end surface of the gate electrode.

BRIEF DESCRIPTION OF DRAWINGS

The above and other aspects, features, and advantages of the present inventive concept will be more clearly understood from the following detailed description, taken in conjunction with the accompanying drawings, in which:

FIG. 2A illustrates cross-sections of the semiconductor device of FIG. 1, taken along lines I-I" and II-II."

FIG. 2B is a cross-sectional view of the semiconductor device of FIG. 1, taken along line III-III."

FIG. 2C is a cross-sectional view of the semiconductor device of FIG. 1, taken along line IV-IV."

FIG. 3A is an enlarged view of a region "A" including a contact plug of FIG. 2B.

DETAILED DESCRIPTION

Hereinafter, example embodiments of the present inventive concept will be described with reference to the accompanying drawings.

Figure 1:
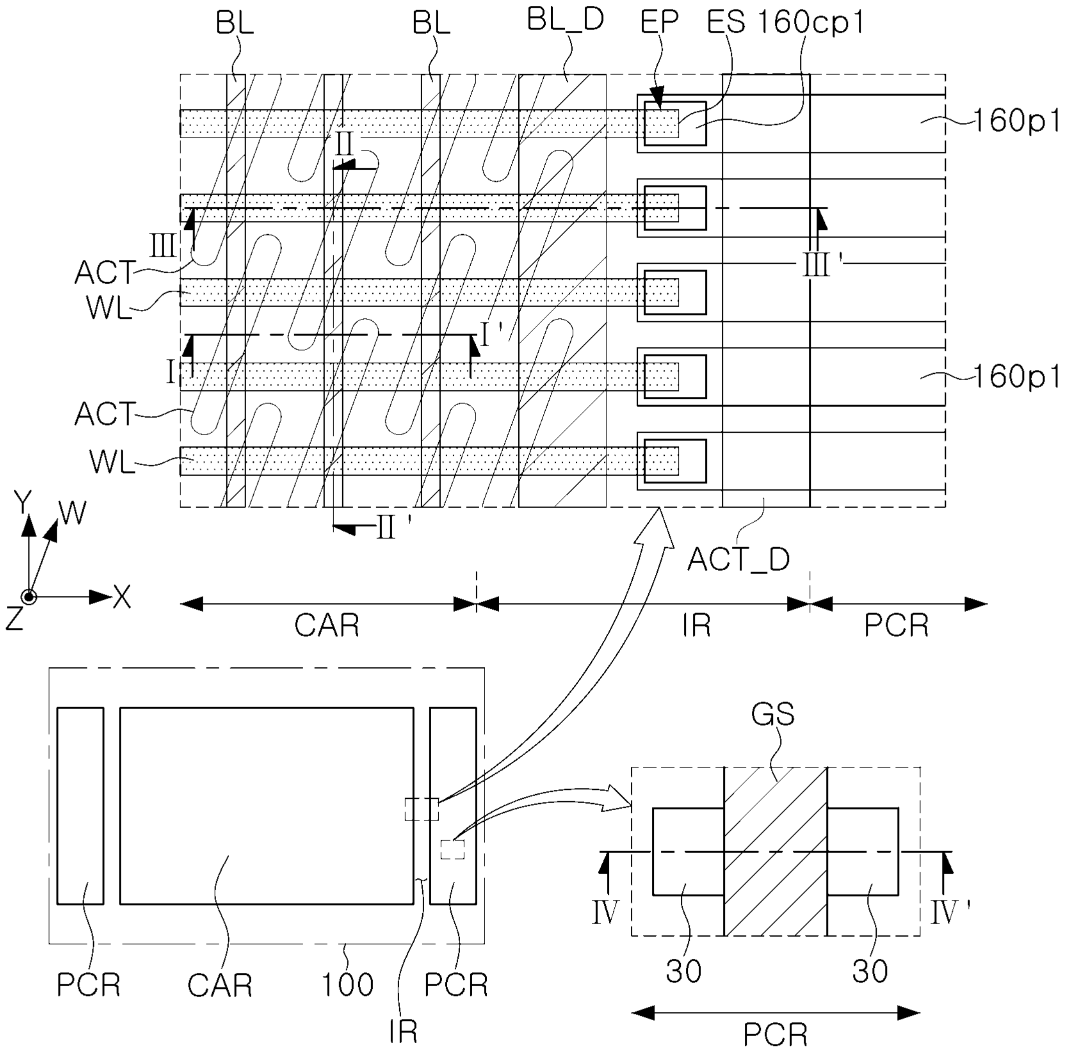
FIG. 1 is a schematic plan view of a semiconductor device according to example embodiments.

FIG. 1 is a schematic plan view of a semiconductor device according to example embodiments.

Figure 2A:
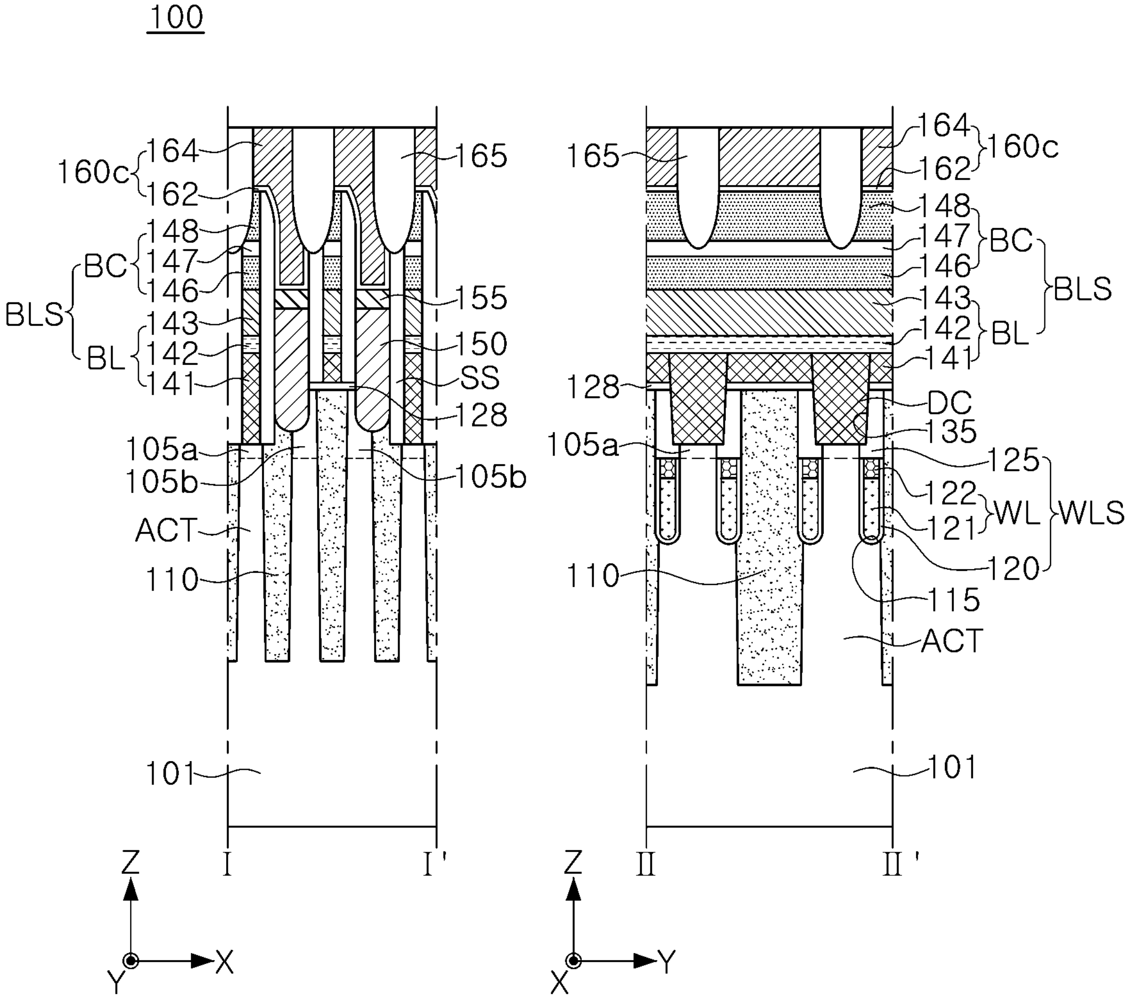
FIG. 2A is a schematic cross-sectional view of a semiconductor device according to example embodiments.

FIG. 2A is a schematic cross-sectional view of a semiconductor device according to example embodiments. FIG. 2A illustrates cross-sections of the semiconductor device of FIG. 1, taken along lines I-I" and II-II."

Figure 2B:
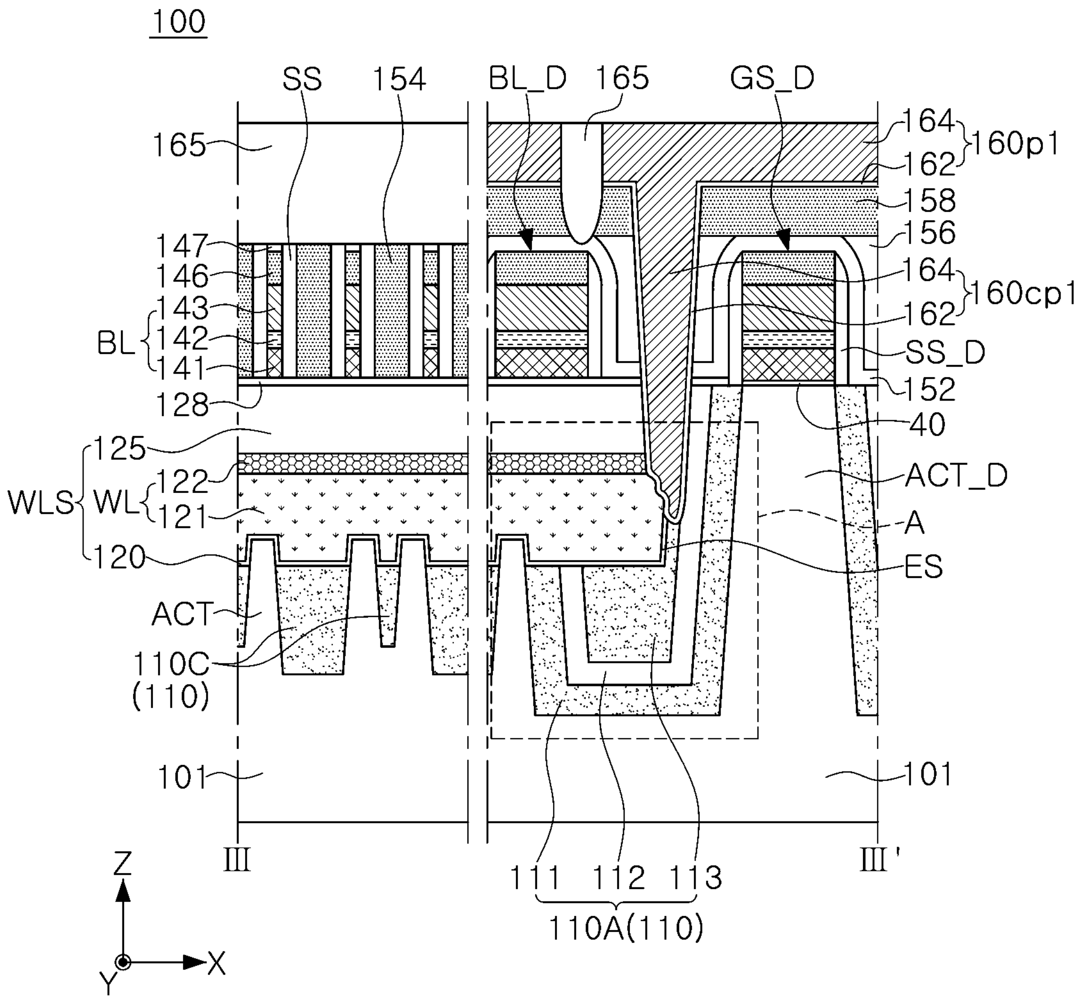
FIG. 2B is a schematic cross-sectional view of a semiconductor device according to example embodiments.

FIG. 2B is a schematic cross-sectional view of a semiconductor device according to example embodiments. FIG. 2B is a cross-sectional view of the semiconductor device of FIG. 1, taken along line III-III."

Figure 2C:
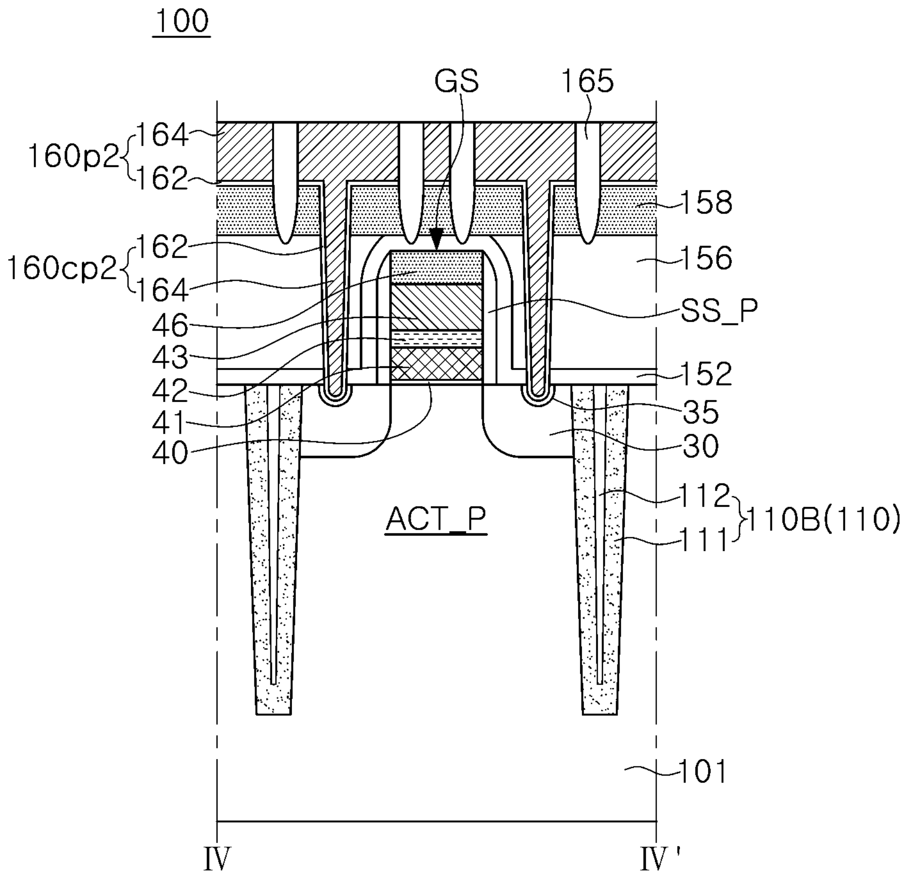
FIG. 2C is a schematic cross-sectional view of a semiconductor device according to example embodiments.

FIG. 2C is a schematic cross-sectional view of a semiconductor device according to example embodiments. FIG. 2C is a cross-sectional view of the semiconductor device of FIG. 1, taken along line IV-IV."

Figure 3A:
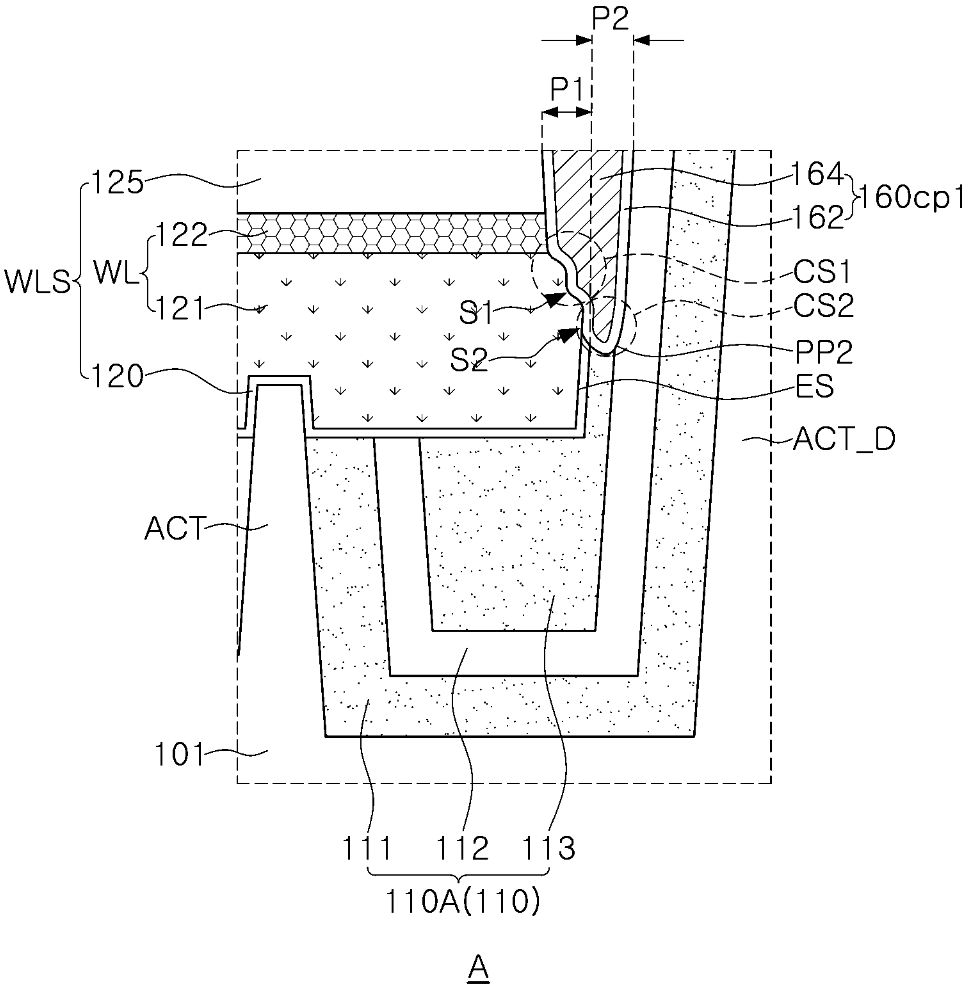
FIG. 3A is a partially enlarged cross-sectional view of a semiconductor device according to example embodiments.

FIG. 3A is a partially enlarged cross-sectional view of a semiconductor device according to example embodiments. FIG. 3A is an enlarged view of a region "A" including a contact plug of FIG. 2B.

Referring to FIG. 1, a semiconductor device 100 may include a cell array region CAR, a peripheral circuit region PCR for driving the cell array region CAR, and a connection region IR between the cell array region CAR and the peripheral circuit region PCR. In the present inventive concept, the regions CAR, PCR, and IR may be defined and described in a substrate 101. The cell array region CAR may be a region in which memory cells are disposed. The peripheral circuit region PCR may be disposed around the cell array region CAR. The peripheral circuit region PCR may be a region in which a word line driver, a sense amplifier, row and column decoders, and control circuits are disposed. The connection region IR may be a region for electrically connecting the cell array region CAR to the peripheral circuit region PCR. For example, in the connection region IR, a word line WL may be electrically connected to a contact plug 160*cp*1, and the contact plug 160*cp*1 may be electrically connected to an upper conductive pattern 160*p*1.

Referring to FIGS. 1 to 3, the semiconductor device 100 may include the substrate 101 including active regions ACT, a device separation region 110 defining the active regions ACT in the substrate 101, a word line structure WLS embedded and extending in the substrate 101 and including the word line WL, and a bit line structure BLS extending to cross (e.g., intersect) the word line structure WLS on the substrate 101 and including a bit line BL. The active regions ACT, the word line structure WLS, and the bit line structure BLS may be disposed in the cell array region CAR.

The semiconductor device 100 may further include a lower conductive pattern 150 on the active region ACT, a first upper conductive pattern 160*c* on the lower conductive pattern 150, a contact plug 160*cp*1 electrically connected to the word line WL in the connection region IR, a second upper conductive pattern 160*p*1 on the contact plug 160*cp*1, a peripheral contact plug 160*cp*2 electrically connected to peripheral source/drain regions 30 in a peripheral circuit region PCR, a third upper conductive pattern 160*p*2 on the peripheral contact plug 160*cp*2, and an insulating pattern 165 penetrating through the upper conductive patterns 160*c*, 160*p*1, and 160*p*2.

The semiconductor device 100 may further include a peripheral transistor disposed on the substrate 101 in the peripheral circuit region PCR, an insulating liner 152, and interlayer insulating layers 156 and 158. The peripheral transistor may include a peripheral gate dielectric layer 40, a first peripheral gate electrode portion 41, a second peripheral gate electrode portion 42, a third peripheral gate electrode portion 43, and a peripheral source/drain region 30.

The semiconductor device 100 may include, for example, a cell array of a dynamic random access memory (DRAM). For example, the bit line BL may be electrically connected to a first impurity region 105*a* of the active region ACT, and a second impurity region 105*b* of the active region ACT may be electrically connected to a capacitor structure on the first upper conductive pattern 160*c* through the lower and upper conductive patterns 150 and 160*c*. Although not shown, the capacitor structure may include, for example, a lower electrode, a capacitor dielectric layer, and an upper electrode, but the structure is not limited thereto.

The substrate 101 may include a semiconductor material, for example, a group IV semiconductor, a group III-V compound semiconductor, or a group II-VI compound semiconductor. For example, the group IV semiconductor may include silicon, germanium, or silicon-germanium. The substrate 101 may further include impurities. The substrate 101 may include a silicon substrate, a silicon-on-insulator (SOI) substrate, a germanium substrate, a germanium on insulator (GOI) substrate, a silicon-germanium substrate, or a substrate including an epitaxial layer.

The active regions ACT may be defined in the substrate 101 by the device separation region 110. The active region ACT may have a bar shape, and may be disposed to have an island shape extending in one horizontal direction, for example, a W direction. The W direction may be a direction inclined with respect to extension directions of the word lines WL and the bit lines BL. The active regions ACT may be arranged parallel to each other, and an end portion of one active region ACT may be arranged adjacent to a center of another active region ACT adjacent thereto.

The active region ACT may have first and second impurity regions 105*a* and 105*b* having a predetermined depth from an upper surface of the substrate 101. The first and second impurity regions 105*a* and 105*b* may be spaced apart from each other. The first and second impurity regions 105*a* and 105*b* may serve as source/drain regions of a transistor formed by the word line WL. For example, a drain region may be formed between two word lines WL crossing one active region ACT, and a source region may be formed outside the two word lines WL. The source region and the drain region may be formed by the first and second impurity regions 105*a* and 105*b* by doping or ion implantation with substantially the same impurities. The source region and the drain region may be interchanged to be named depending on a circuit configuration of a finally formed transistor. The impurities may include dopants having a conductivity type opposite to that of the substrate 101. In example embodiments, depths of the first and second impurity regions 105*a* and 105*b* in the source region and the drain region may be different from each other.

The device separation region 110 may be formed by a shallow trench isolation (STI) process. The device separation region 110 surrounds the active regions ACT and may electrically separate the active regions ACT from each other. The device separation region 110 may be formed of an insulating material, for example, silicon oxide, silicon nitride, or a combination thereof. The device separation region 110 may include a plurality of regions having different bottom depths according to a width of a trench formed by etching the substrate 101.

The device separation region 110 may include a first device separation layer 110C defining the cell active region ACT on the cell array region CAR, a second device separation layer 110B defining a peripheral active region ACT_P on the peripheral circuit region PCR, and a third device separation layer 110A defining an active dam ACT_D on the connection region IR. The active dam ACT_D may protrude from the substrate 101, and an upper surface of the active dam ACT_D may be disposed at substantially the same level as (e.g., may be coplanar with) the upper surface of the gate capping layer 125. A dummy gate structure GS_D may be disposed on the active dam ACT_D, but is not limited thereto.

In the connection region IR, the device separation region 110 may include a plurality of layers. For example, as shown in FIG. 2B, the third device separation layer 110A may include a first insulating liner 111, a second insulating liner 112, and an embedded insulating layer 113 in a region adjacent to an end portion EP of the word lines WL. The second insulating liner 112 may be disposed on the first insulating liner 111, and the embedded insulating layer 113 may be disposed on the second insulating liner 112. In the etched trench of the substrate 101 in which the third device separation layer 110A is disposed, the first insulating liner 111 and the second insulating liner 112 may be conformally formed on a surface of the trench sequentially. The embedded insulating layer 113 may fill a space in which the first and second insulating liners 111 and 112 do not fill the trench. The second insulating liner 112 may include an insulating material different from that of the first insulating liner 111, and the embedded insulating layer 113 may include an insulating material different from that of the second insulating liner 112. For example, the first insulating liner 111 and the embedded insulating layer 113 may include silicon oxide, and the second insulating liner 112 may include silicon nitride.

The word line structures WLS may be disposed in the gate trenches 115 extending in the substrate 101. Each of the word line structures WLS may include a gate dielectric layer 120, the word line WL, and a gate capping layer 125. In the present inventive concept, a "gate (120, WL)" may be referred to as a structure including the gate dielectric layer 120 and the word line WL, and the word line WL may be referred to as a "gate electrode," and the word line structure WLS may be referred to as a "gate structure."

The word line WL may be disposed to extend in the first direction X across the active region ACT. For example, a pair of adjacent word lines WL may be disposed to cross one active region ACT. The word line WL may constitute a gate of a buried channel array transistor (BCAT), but is not limited thereto. In example embodiments, the word lines WL may be disposed on the substrate 101. The word line WL may be disposed in the gate trench 115 and have a predetermined thickness. An upper surface of the word line WL may be positioned at a level lower than that of an upper surface of the substrate 101. In the present inventive concept, the term "level" which is high or low may be defined based on a substantially flat upper surface of the substrate 101.

The word line WL may include a conductive material, for example, at least one of polycrystalline silicon (Si), titanium (Ti), titanium nitride (TiN), tantalum (Ta), tantalum nitride (TaN), tungsten (W), tungsten nitride (WN), and aluminum (Al). For example, the word line WL may include a lower pattern 121 and an upper pattern 122 formed of different materials. For example, the lower pattern 121 may include at least one of tungsten (W), titanium (Ti), tantalum (Ta), tungsten nitride (WN), titanium nitride (TiN), and tantalum nitride (TaN). For example, the upper pattern 122 may be a semiconductor pattern including polysilicon doped with P-type or N-type impurities, and the lower pattern 121 may be a metal pattern including at least one of a metal and a metal nitride. A thickness of the lower pattern 121 may be thicker than a thickness of the upper pattern 122. The lower pattern 121 and the upper pattern 122 may each extend in a first direction X.

The gate dielectric layer 120 may be disposed on a bottom surface and inner surfaces of the gate trench 115. The gate dielectric layer 120 may conformally cover an inner side wall of the gate trench 115. The gate dielectric layer 120 may include at least one of silicon oxide, silicon nitride, and silicon oxynitride. The gate dielectric layer 120 may be, for example, a silicon oxide film or an insulating film having a high dielectric constant. In example embodiments, the gate dielectric layer 120 may be a layer formed by oxidizing the active region ACT or a layer formed by deposition.

The gate capping layer 125 may be disposed to fill the gate trench 115 on the word line WL. An upper surface of the gate capping layer 125 may be positioned at substantially the same level as that of the upper surface of the substrate 101. The gate capping layer 125 may be formed of an insulating material, for example, silicon nitride.

The bit line structure BLS may extend in one direction, for example, a Y direction to cross the word line WL. The bit line structure BLS may include a bit line BL and a bit line capping pattern BC on the bit line BL. The bit line structure BLS may be disposed on the cell array region CAR, and a dummy bit line structure BL_D having a larger width in the X direction than the bit line structure BLS may be disposed in the connection region IR. The dummy bit line structure BL_D may have a structure similar to that of the bit line structure BLS, except that the dummy bit line structure has a larger width.

The bit line BL may include a first conductive pattern 141, a second conductive pattern 142, and a third conductive pattern 143 being sequentially stacked. A bit line capping pattern BC may be disposed on the third conductive pattern 143. A buffer insulating layer 128 may be disposed between the first conductive pattern 141 and the substrate 101, and a portion (hereinafter, a bit line contact pattern DC) of the first conductive pattern 141 may be in contact with the first impurity region 105*a* of the active region ACT. The bit line BL may be electrically connected to the first impurity region 105*a* through the bit line contact pattern DC. A lower surface of the bit line contact pattern DC may be positioned at a level lower than that of the upper surface of the substrate 101, and may be positioned on a higher level than that of the upper surface of the word line WL. In an example embodiment, the bit line contact pattern DC may be formed in the substrate 101 to be locally disposed in a bit line contact hole 135 exposing the first impurity region 105*a*.

The first conductive pattern 141 may include a semiconductor material such as polycrystalline silicon. The first conductive pattern 141 may directly contact the first impurity region 105*a*. The second conductive pattern 142 may include a metal-semiconductor compound. The metal-semiconductor compound may be, for example, a layer formed by siliciding a portion of the first conductive pattern 141. For example, the metal-semiconductor compound may include cobalt silicide (CoSi), titanium silicide (TiSi), nickel silicide (NiSi), tungsten silicide (WSi), or other metal silicides. The third conductive pattern 143 may include a metal material such as titanium (Ti), tantalum (Ta), tungsten (W), and aluminum (Al). The number of conductive patterns constituting the bit line BL, the type of material, and/or a stacking order may be variously changed according to example embodiments.

The bit line capping pattern BC may include a first capping pattern 146, a second capping pattern 147, and a third capping pattern 148 sequentially stacked on the third conductive pattern 143. Each of the first to third capping patterns 146, 147, and 148 may include an insulating material, for example, a silicon nitride film. The first to third capping patterns 146, 147, and 148 may be formed of different materials, and even if the first to third capping patterns 146, 147, and 148 include the same material, boundaries thereof may be apparent due to differences in physical properties. A thickness of the second capping pattern 147 may be less than a thickness of the first capping pattern 146 and a thickness of the third capping pattern 148. The number of capping patterns and/or the type of material constituting the bit line capping pattern BC may be variously changed according to embodiments.

Spacer structures SS may be disposed on both sidewalls of each of the bit line structures BLS and extend in one direction, for example, the Y direction. The spacer structures SS may be disposed between the bit line structure BLS and the lower conductive pattern 150. The spacer structures SS may be disposed to extend along sidewalls of the bit line BL and sidewalls of the bit line capping pattern BC. A pair of spacer structures SS disposed on opposite sides of one bit line structure BLS may have an asymmetric shape with respect to the bit line structure BLS. Each of the spacer structures SS may include a plurality of spacer layers, and may further include an air spacer according to embodiments.

The lower conductive pattern 150 may be electrically connected to one region of the active region ACT, for example, the second impurity region 105*b*. The lower conductive pattern 150 may be disposed between the bit lines BL and between the word lines WL. The lower conductive pattern 150 may pass through the buffer insulating layer 128 to be electrically connected to the second impurity region 105*b* of the active region ACT. The lower conductive pattern 150 may directly contact the second impurity region 105*b*. A lower surface of the lower conductive pattern 150 may be located at a level lower than that of an upper surface of the substrate 101, and may be located at a level higher than that of a lower surface of the bit line contact pattern DC. The lower conductive pattern 150 may be insulated from the bit line contact pattern DC by the spacer structure SS. The lower conductive pattern 150 may be formed of a conductive material and may include at least one of, for example, polycrystalline silicon (Si), titanium (Ti), titanium nitride (TiN), tantalum (Ta), tantalum nitride (TaN), tungsten (W), tungsten nitride (WN), and aluminum (Al). In an example embodiment, the lower conductive pattern 150 may include a plurality of layers.

A metal-semiconductor compound layer 155 may be disposed between the lower conductive pattern 150 and the first upper conductive pattern 160*c*. The metal-semiconductor compound layer 155 may be, for example, a layer formed by siliciding a portion of the lower conductive pattern 150 when the lower conductive pattern 150 includes a semiconductor material. The metal-semiconductor compound layer 155 may include, for example, cobalt silicide (CoSi), titanium silicide (TiSi), nickel silicide (NiSi), tungsten silicide (WSi), or other metal silicide. In some embodiments, the metal-semiconductor compound layer 155 may be omitted.

The first upper conductive pattern 160*c* may be disposed on the lower conductive pattern 150 in the cell array region CAR. The first upper conductive pattern 160*c* may extend between the spacer structures SS to cover the upper surface of the metal-semiconductor compound layer 155. The second and third upper conductive patterns 160*p*1 and 160*p*2 may be disposed on the connection region IR and the peripheral circuit region PCR. Respective upper surfaces of the first to third upper conductive patterns 160*c*, 160*p*1, and 160*p*2 may be disposed on substantially the same level as (e.g., may be coplanar with) each other. The upper conductive patterns 160*c*, 160*p*1, and 160*p*2 may include a barrier layer 162 and a conductive layer 164, respectively. The barrier layer 162 may cover a lower surface and side surfaces of the conductive layer 164. The barrier layer 162 may include a metal nitride, for example, at least one of titanium nitride (TiN), tantalum nitride (TaN), and tungsten nitride (WN). The conductive layer 164 may include a conductive material, for example, at least one of polycrystalline silicon (Si), titanium (Ti), tantalum (Ta), tungsten (W), ruthenium (Ru), copper (Cu), molybdenum (Mo), platinum (Pt), nickel (Ni), cobalt (Co), aluminum (Al), titanium nitride (TiN), tantalum nitride (TaN), and tungsten nitride (WN).

The contact plug 160*cp*1 may be electrically connected to an end portion EP of the word line WL. The contact plug 160*cp*1 may be provided in the connection region IR. The end portion EP of the word line WL may provide an end surface ES exposed in the extension direction of the word line WL, that is, in the first direction X, and the contact plug 160*cp*1 may be disposed to overlap the end portion EP of the word line WL in the vertical direction Z. For example, the contact plug 160*cp*1 may include a first portion P1 overlapping the word line WL and a second portion P2 not overlapping the word line WL. In some embodiments, the end surface ES may be closer than a recessed portion of the word line WL to a side surface of the second insulating liner 112.

The end portion EP of the word line WL may be disposed on the third device separation layer 110A covering the sidewall of the active region ACT adjacent thereto. For example, the end portion EP of the word line WL may be disposed on the third device separation layer 110A including the first insulating liner 111, the second insulating liner 112, and the embedded insulating layer 113.

A lower portion of the contact plug 160*cp*1 may include a first contact portion CS1 and a second contact portion CS2 in contact with the word line WL, as shown in FIG. 3A. The first contact portion CS1 may be a portion in contact with the word line WL on the second contact portion CS2, and the second contact portion CS2 may be a portion in contact with the end surface ES of the word line WL.

The first contact portion CS1 may provide a first contact surface S1 between the contact plug 160*cp*1 and the word line WL, and the first contact surface S1 may be a portion formed as the end portion EP of the word line WL is recessed by the contact plug 160*cp*1. The first contact surface S1 may include a portion which is convexly curved toward the word line WL from the contact plug 160*cp*1, and may include a portion having a wave pattern profile or a portion having a plurality of steps/ridges. In some embodiments, the first contact surface S1 of the contact plug 160*cp*1 may contact the end portion EP of the word line WL.

The second contact portion CS2 may include a protrusion PP2 extending downwardly along the end surface ES of the word line WL between the end surface ES and the second insulating liner 112. The second contact portion CS2 may provide a second contact surface S2 between the contact plug 160*cp*1 and the word line WL, and the second contact surface S2 may be a portion in which the protrusion PP2 of the second contact portion CS2 is in contact with the end surface ES of the word line WL. In some embodiments, the protrusion PP2 may be in contact with (i) an upper surface of the embedded insulating layer 113 and (ii) a side surface of the second insulating liner 112.

Moreover, the first and second contact surfaces S1, S2 may be first and second portions, respectively, of a continuous surface of the contact plug 160*cp*1. Accordingly, a recessed portion of the end portion EP of the word line WL (which may be a gate electrode) may be in contact with the first portion S1 of the surface of the contact plug 160*cp*1, and the end surface ES of the word line WL may be in contact with the second portion S2 of the surface of the contact plug 160*cp*1. For example, the end surface ES may be a lower portion of the end portion EP, and the recessed portion of the end portion EP may be an upper portion of the end portion EP. By providing the convex portion of the first contact surface S1 and the protrusion PP2 of the second contact surface S2, a contact area between the contact plug 160*cp*1 and the word line WL may increase to decrease contact resistance. Accordingly, electrical characteristics of the semiconductor device may be improved.

The word line WL may include a first side and a second side connected to the end surface ES and opposing each other in the second direction Y, and the contact plug 160*cp*1 may be in contact with at least three sides of the word lines WL, for example, the end surface ES, the first side, and the second side of the word line WL. The contact plug 160*cp*1 may have a width wider than the width of the word line WL in an X-Y plane. A contact area between the contact plug 160*cp*1 and the word line WL may increase to reduce contact resistance.

The contact plug 160*cp*1 may extend longer in the first direction X than in the second direction Y. For example, the contact plug 160*cp*1 may have a long bar shape that extends longitudinally in the first direction X. As another example, the contact plug 160*cp*1 may have an elliptical shape elongated in the first direction X.

The contact plug 160*cp*1 may include a barrier layer 162 and a conductive layer 164. The contact plug 160*cp*1 may be electrically connected to the second upper conductive pattern 160*p*1 and may be integrally formed with the second upper conductive pattern 160*p*1. The contact plug 160*cp*1 may be completely overlapped by the second upper conductive pattern 160*p*1 in the vertical direction Z.

The peripheral contact plug 160*cp*2 may pass through the first and second interlayer insulating layers 156 and 158 and the insulating liner 152 in the peripheral circuit region PCR to be electrically connected to the peripheral source/drain regions 30. A peripheral metal-semiconductor compound layer 35 may be disposed between the peripheral contact plug 160*cp*2 and the peripheral source/drain regions 30. The peripheral contact plug 160*cp*2 may be electrically connected to the third upper conductive pattern 160*p*2, and may be integrally formed with the third upper conductive pattern 160*p*2.

The insulating patterns 165 may be disposed to penetrate through the upper conductive patterns 160*c*, 160*p*1, and 160*p*2. A plurality of upper conductive patterns 160*c*, 160*p*1, and 160*p*2 may be separated from each other by insulating patterns 165. The insulating patterns 165 may include an insulating material, for example, at least one of silicon oxide, silicon nitride, and silicon oxynitride.

A peripheral gate structure GS may be disposed on the peripheral active region ACT_P in the peripheral circuit region PCR. The peripheral gate structure GS may include a peripheral gate dielectric layer 40, a first peripheral gate electrode portion 41, a second peripheral gate electrode portion 42, a third peripheral gate electrode portion 43, and a peripheral gate capping layer 46 being sequentially stacked. The insulating liner 152 may cover the peripheral gate structure GS. The peripheral active region ACT_P may be defined by a second device separation layer 110B, and the second device separation layer 110B may include a first insulating liner 111 and a second insulating liner 112, but is not limited thereto. The peripheral gate dielectric layer 40 may include silicon oxide, silicon nitride, or a high-k material. The term “high-k material” may refer to a dielectric material having a higher dielectric constant than silicon oxide. The first peripheral gate electrode portion 41, the second peripheral gate electrode portion 42, and the third peripheral gate electrode portion 43 may have a structure and material similar to that of the bit line BL, or may have a shape wider than that of the bit line BL.

In the connection region IR and the peripheral circuit region PCR, first and second interlayer insulating layers 156 and 158 may be sequentially disposed on the insulating liner 152. The first interlayer insulating layer 156 and the second interlayer insulating layer 158 may include different insulating materials. For example, the first interlayer insulating layer 156 may be formed of silicon oxide, and the second interlayer insulating layer 158 may be formed of silicon nitride.

FIGS. 3B, 4A, 4B, 4C, 5, 6, and 7 are partially enlarged cross-sectional views of semiconductor devices according to example embodiments. FIGS. 3B, 4A, 4B, 4C, 5, 6, and 7 show regions corresponding to FIG. 3A.

Figure 3B:
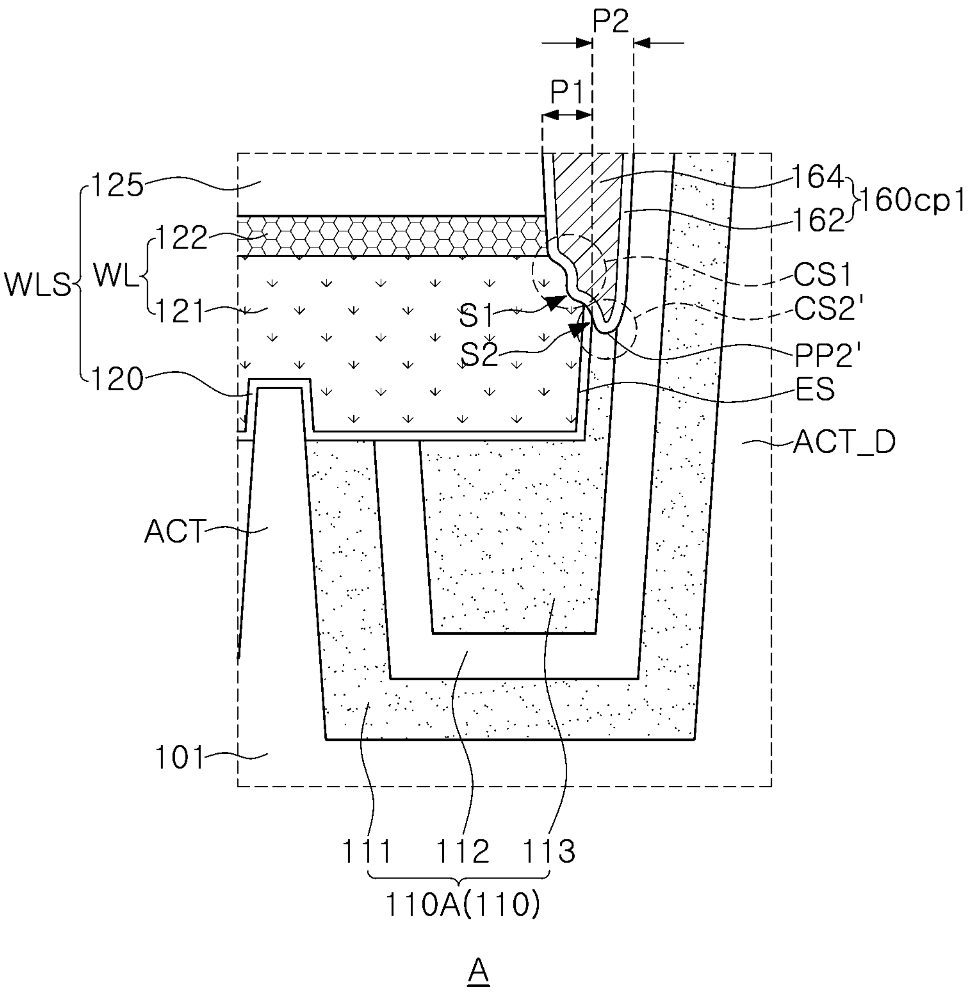
FIGS. 3B, 4A, 4B, 4C, 5, 6, and 7 are partially enlarged cross-sectional views of a semiconductor device according to example embodiments.

Referring to FIG. 3B, a second contact portion CS2' of the contact plug 160*cp* may include a protrusion PP2', and the protrusion PP2' may be disposed between the gate dielectric layer 120 covering the end surface ES of the word line WL and the second insulating liner 112. The protrusion PP2' may protrude downward between the end surface ES of the word line WL and the second insulating liner 112.

Figure 4A:
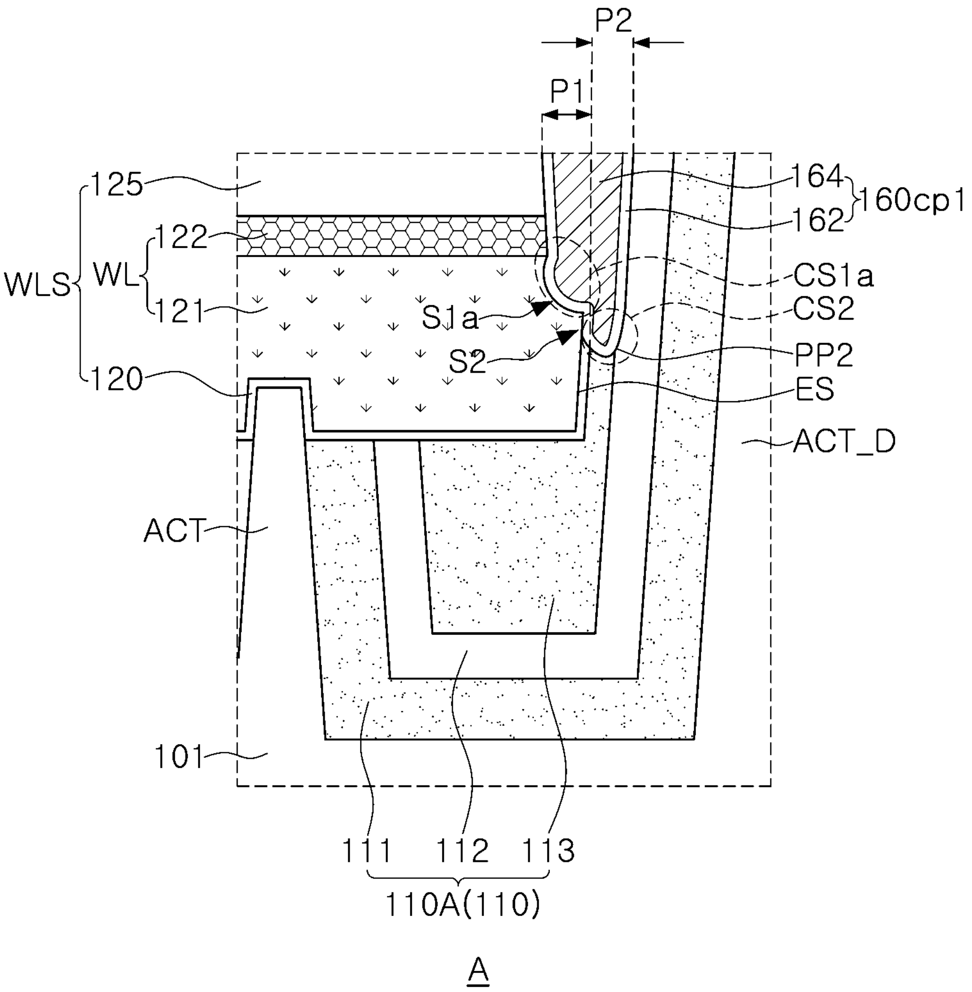

Referring to FIG. 4A, the first contact surface Sla of the first contact portion CS1*a* of the contact plug 160*cp*1 may include curved portion which is convex toward an upper portion of the word line WL from the contact plug 160*cp*1. In the case of an embodiment in which the word line WL is formed only of a metal nitride such as titanium nitride (TiN), a curved profile of the first contact surface S1*a* of the first contact portion CS1*a* of the contact plug 160*cp*1 may be deepened. For example, an area of the convexly curved portion of the first contact surface S1*a* may be greater than an area of the convexly curved portion of the first contact surface S1 in an embodiment in which the word line WL is formed as a barrier layer of metal nitride (e.g., TiN) and a conductive layer of a metal (W).

Figure 4B:
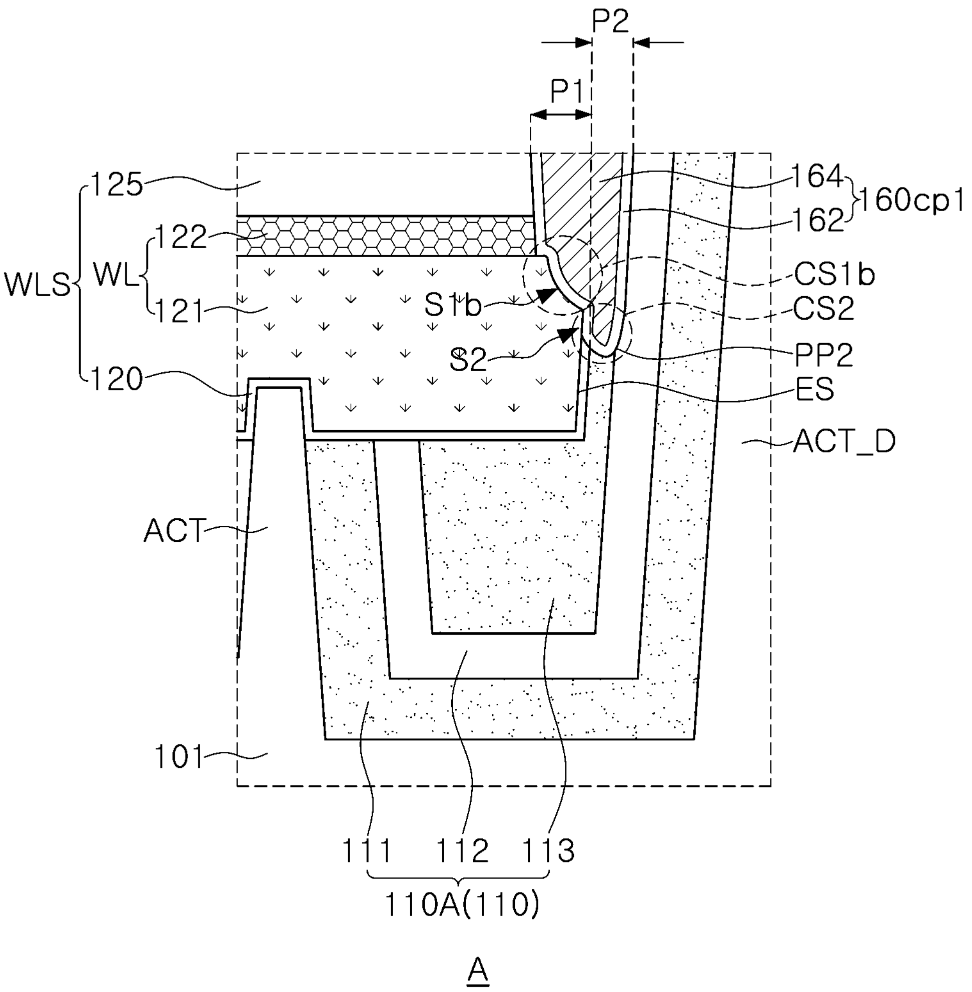

Referring to FIG. 4B, the contact plug 160*cp*1 may have a bent portion near a boundary between the upper pattern 122 and the lower pattern 121. The first contact surface S1*b* of the first contact portion CS1*b* of the contact plug 160*cp*1 may be convexly curved from the contact plug 160*cp*1 toward the upper portion of the word line WL, but an area of the convexly curved portion may be relatively smaller than that of the first contact surface S1*a*.

Figure 4C:
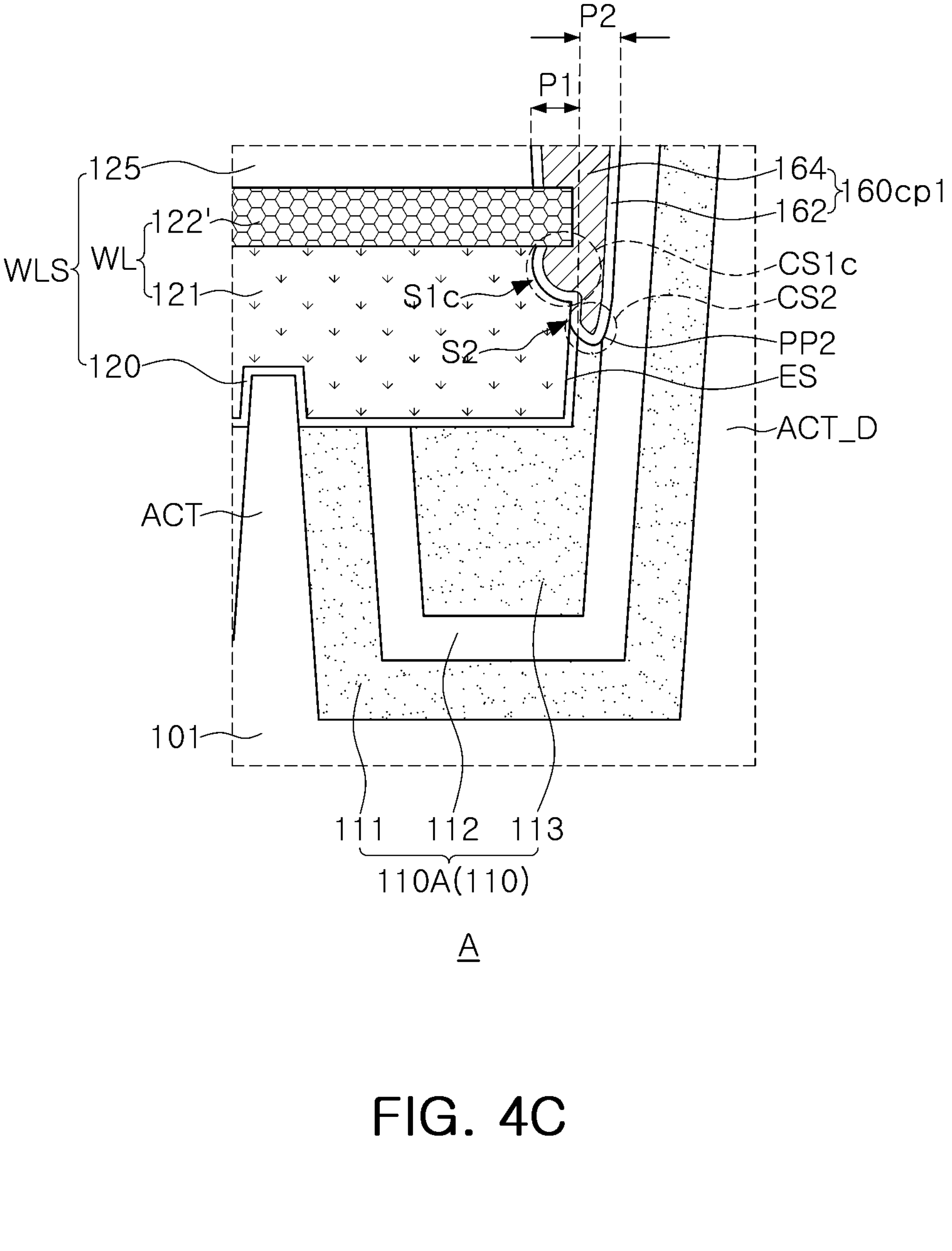

Referring to FIG. 4C, when the upper pattern 122' has a thickness greater than that of the upper pattern 122, the first contact portion CS1*c* of the contact plug 160*cp*1 may protrude directly below a lower surface of the upper pattern 122'. The contact plug 160*cp*1 may cover a portion of an upper surface and an end surface of the upper pattern 122'. The first contact portion CS1*c* may be vertically (i.e., in the direction Z) overlapped by the upper pattern 122'. When the thickness of the upper pattern 122' is relatively thick so a portion of the upper pattern 122' is not etched during an etching process for forming the contact plug 160*cp*1, since the contact plug 160*cp*1 has the first contact portion CS1*c*, the contact plug 160*cp*1 may be stably connected, and since the first contact surface S1*c* of the first contact portion CS1*c* includes a convex portion, a contact area may be increased and electrical resistance may be reduced.

Figure 5:
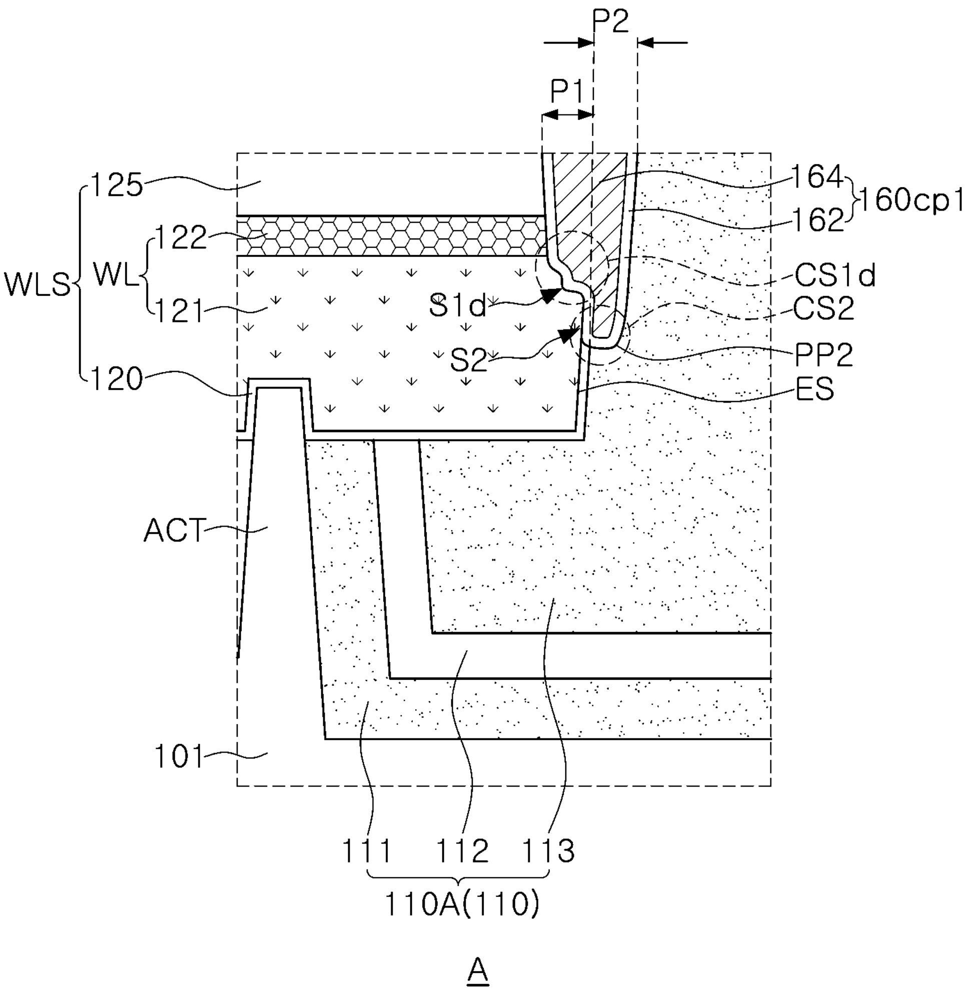

Referring to FIG. 5, the active dam ACT_D adjacent to the word line WL may not be disposed, and the contact plug 160*cp*1 may not contact the first and second insulating liners 111 and 112. The contact plug 160*cp*1 may have a first contact portion CS1*d*, and the first contact surface S1*d* of the first contact portion CS1*d* may have a profile of a plurality of steps/ridges or a wave pattern. By providing the first contact surface S1*d*, a contact area may be increased to reduce electrical resistance.

Figure 6:
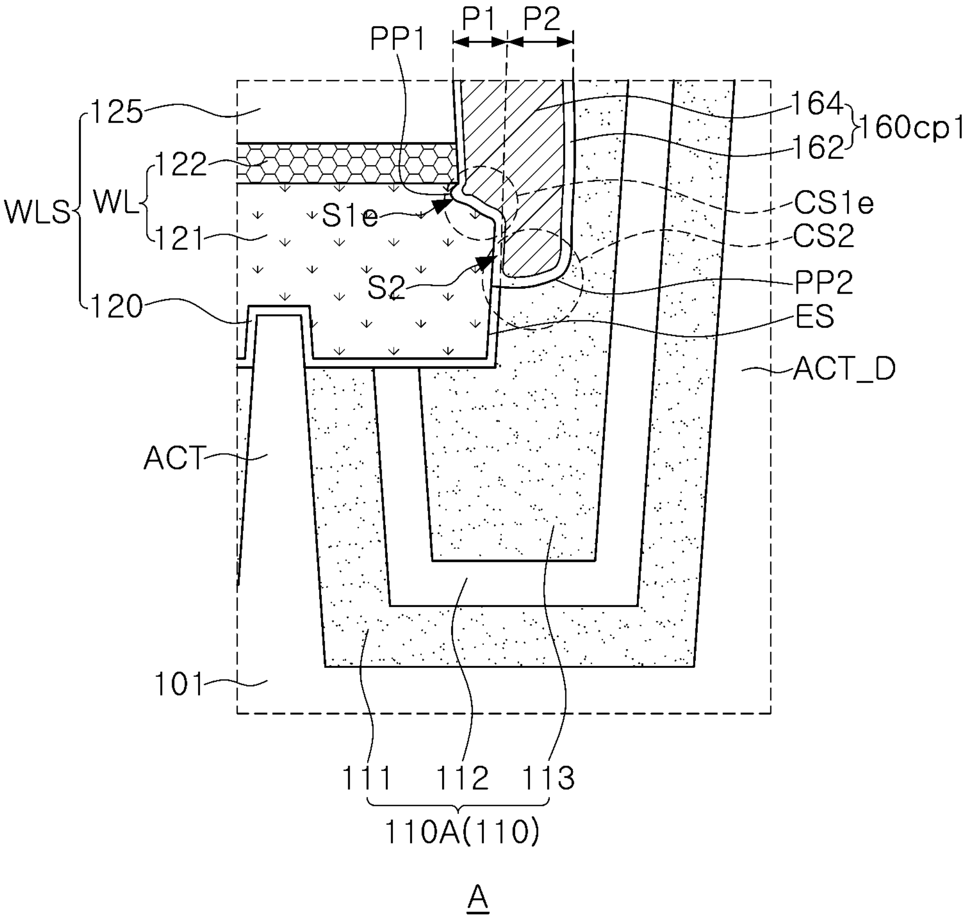

Referring to FIG. 6, the first contact portion CS1*e* of the contact plug 160*cp*1 may include a first protrusion PP1 protruding horizontally to a region immediately below a lower surface of the upper pattern 122 from a portion of the first contact portion CS1*e* in contact with a side surface of the upper pattern 122. In other words, the first contact portion CS1*e* may include the first protrusion PP1 adjacent/in contact with the side surface of the upper pattern 122 and horizontally (i.e., laterally) extending to a region immediately below the lower surface of the upper pattern 122 from an overlap portion P1 overlapping the lower pattern 121. The first protrusion PP1 may be overlapped by a lower surface of the upper pattern 122 in the third direction Z, perpendicular to the upper surface of the substrate 101 and the upper pattern 122. A surface in which the first contact portion CS1*e* is in contact with an upper portion of the lower pattern 121 may be a curved surface convex toward the upper portion of the lower pattern 121. At a level lower than the first protrusion PP1, a lower surface of the first contact portion CS1*e* may be an inclined surface. The first protrusion PP1 may form an acute angle with the lower surface of the upper pattern 122. The contact plug 160*cp*1 may include the barrier layer 162 and the conductive layer 164, and the barrier layer 162 may be bent/inclined to the region immediately below the lower surface of the upper pattern 122 from the portion in contact with the side surface of the upper pattern 122.

Figure 7:
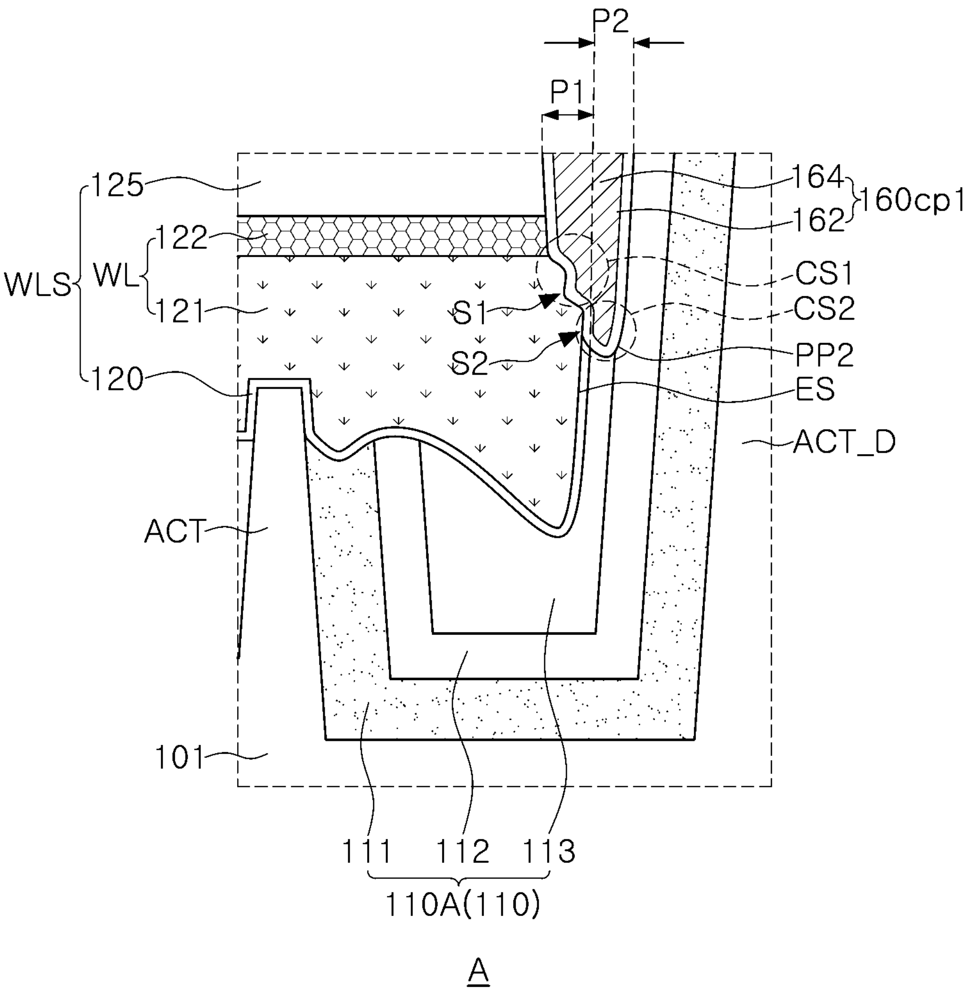

Referring to FIG. 7, the word line WL may be disposed to partially recess the third device separation layer 110A including the first insulating liner 111, the second insulating liner 112, and the embedded insulating layer 113. Accordingly, the lower pattern 121 of the word line WL may include a portion protruding toward the second insulating liner 112 below the end portion EP.

Figure 8A:
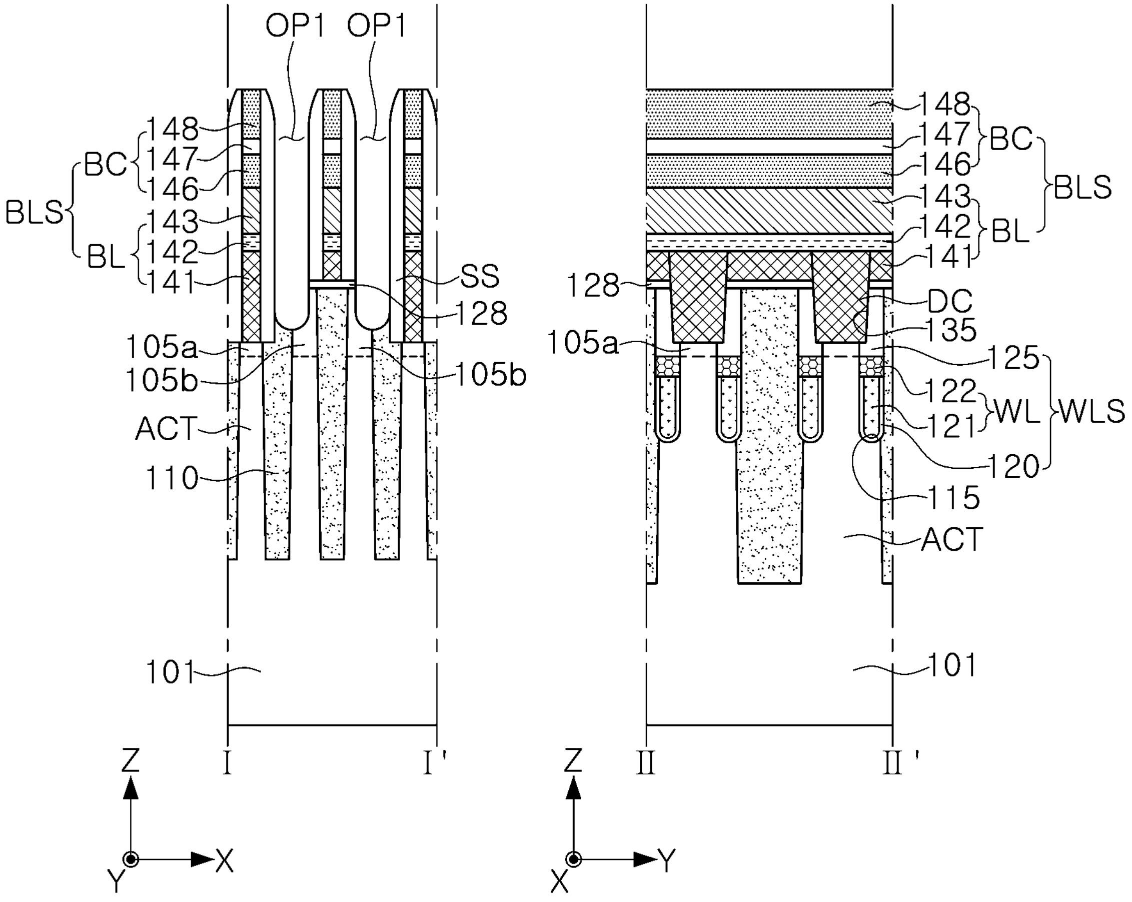
FIGS. 8A, 8B, 8C, 9A, 9B, and 9C are cross-sectional views illustrating a method of manufacturing a semiconductor device according to example embodiments.
Figure 8B:
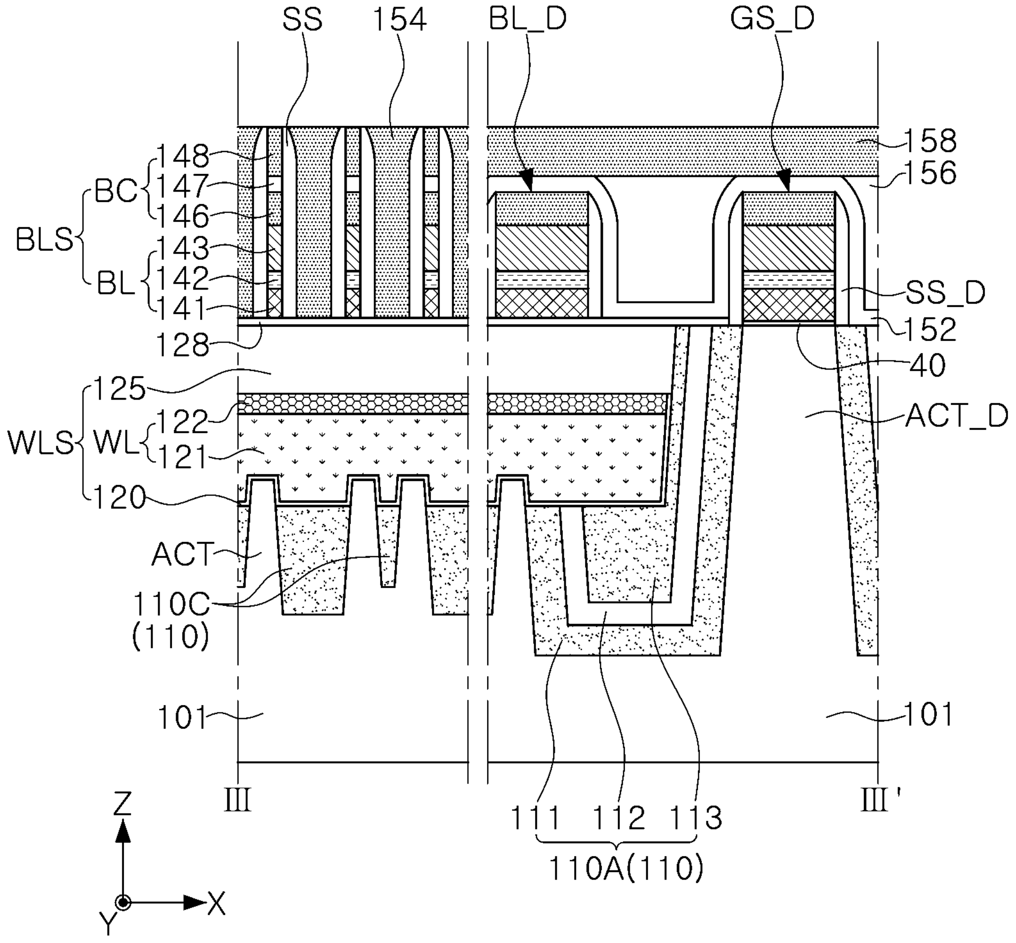
Figure 8C:
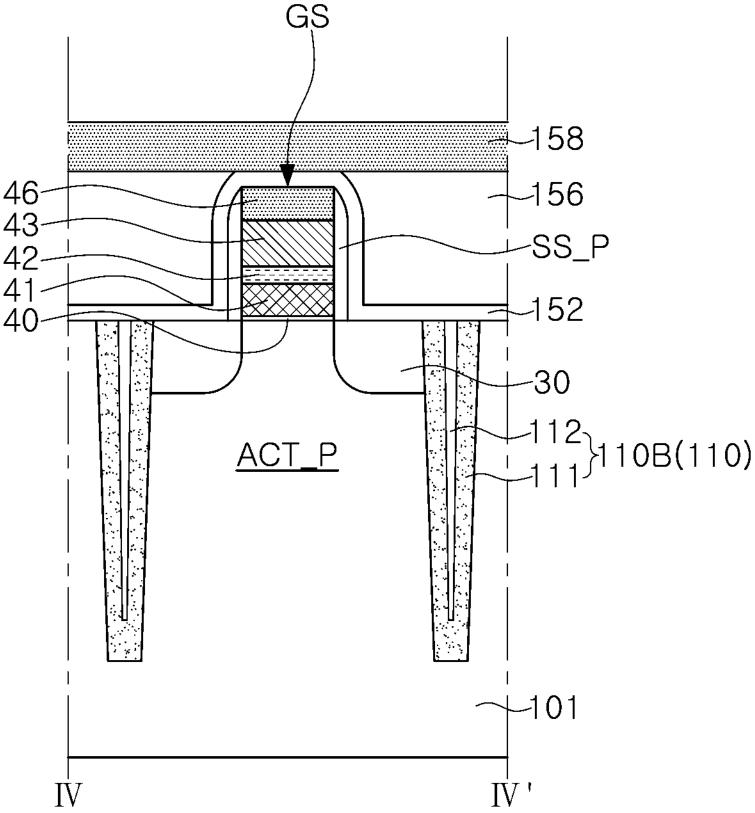
Figure 9A:
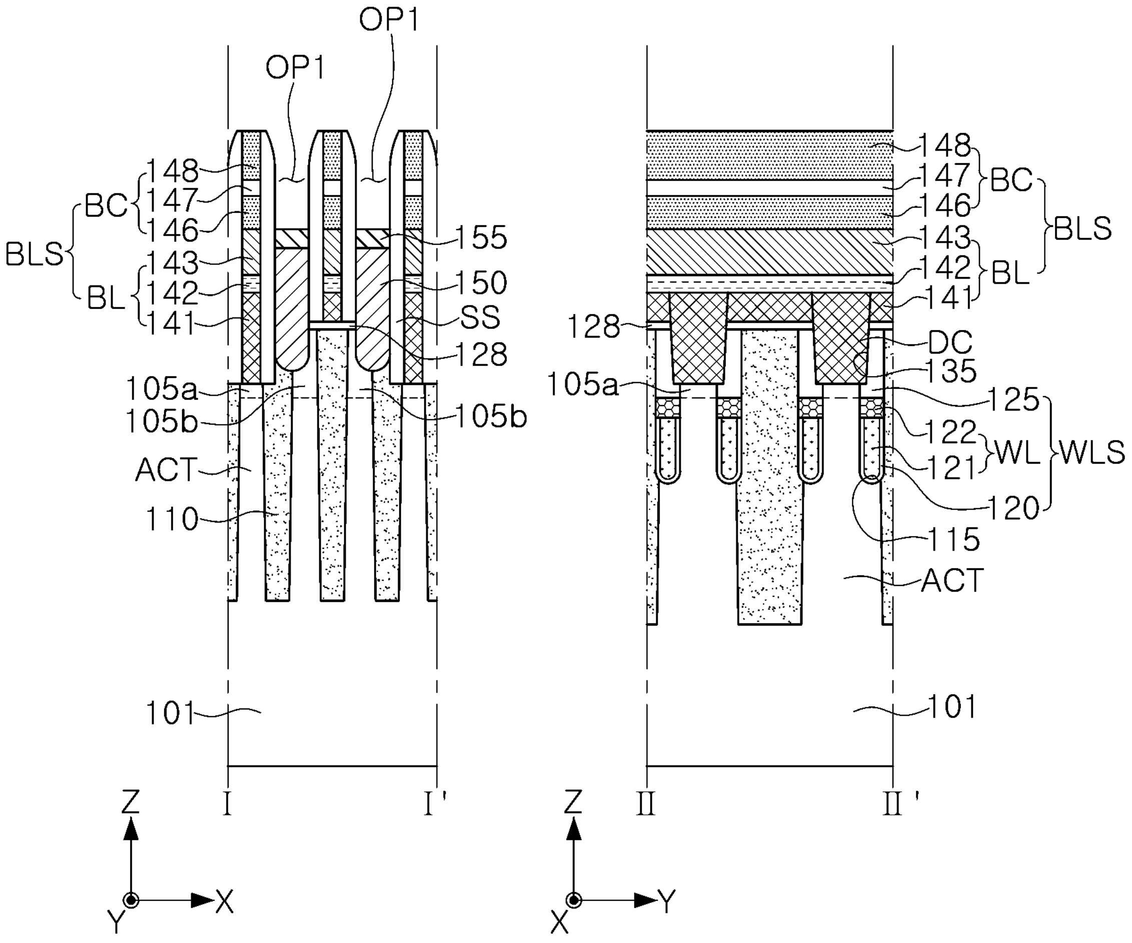
Figure 9B:
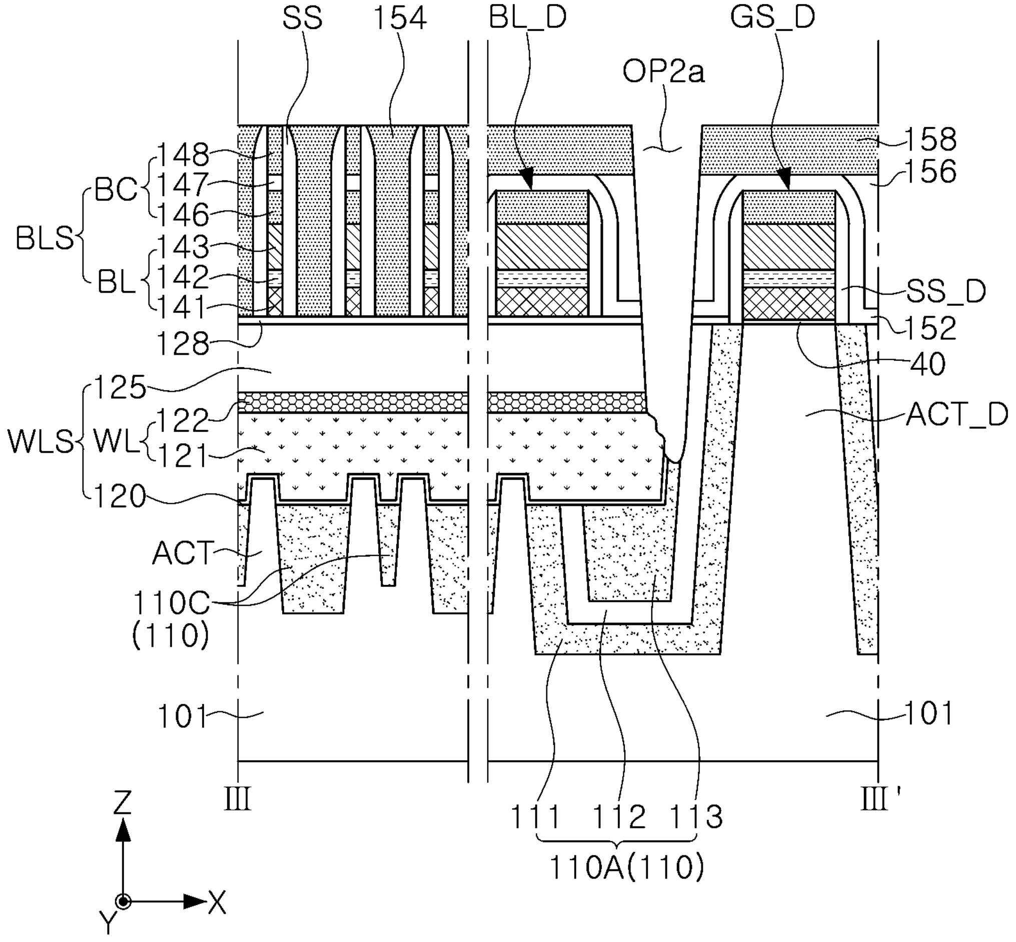
Figure 9C:
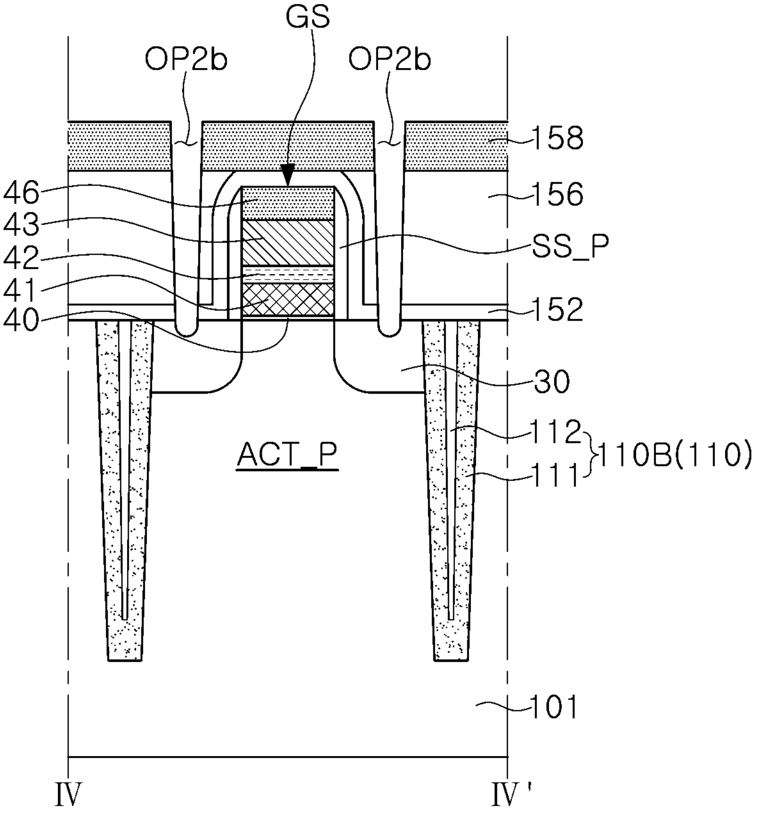

Referring to FIGS. 1, 8A, and 8C, the device separation region 110 may be formed in the substrate 101 to define the cell active region ACT in the cell array region CAR and define the peripheral active region ACT_P in the connection region IR. In the peripheral circuit region PCR, the peripheral active region ACT_P may be defined. A device separation trench may be formed in the substrate 101, and the device separation region 110 may fill the device separation trench. In a plan view, the active region ACT may have a bar shape elongated in the W direction. Impurity regions may be formed in/on the active region ACT by performing an ion implantation process using the device separation region 110 as an ion implantation mask. The active region ACT and the device separation region 110 may be patterned to form a gate trench 115. A pair of gate trenches 115 may cross the active region ACT, but the present inventive concept is not limited thereto. The impurity regions may also be separated by the gate trench 115 to form a first impurity region 105*a* and a second impurity region 105*b*.

The gate dielectric layer 120 may be formed on an inner surface of the gate trench 115 to have a substantially conformal thickness. Subsequently, the lower pattern 121 and the upper pattern 122 may be formed to fill the gate trench 115, and an upper portion of the upper pattern 122 may be partially etched to form the word line WL. The upper surface of the word line WL may be recessed to be lower than the upper surface of the active region ACT. A gate capping layer 125 may be formed on the word line WL by stacking an insulating layer on the substrate 101 to fill the gate trench 115 and performing etching.

An insulating layer and a conductive layer are sequentially formed and patterned on the entire surface of the substrate 101 to form the buffer insulating layer 128 and the first conductive pattern 141 being sequentially stacked. The buffer insulating layer 128 may be formed of at least one of silicon oxide, silicon nitride, and silicon oxynitride. A plurality of buffer insulating layers 128 may be formed to be spaced apart from each other. The first conductive pattern 141 may have a shape corresponding to a planar shape of the buffer insulating layer 128. The buffer insulating layer 128 may be formed to simultaneously cover the ends of the two adjacent active regions ACT, that is, the adjacent second impurity regions 105*b*. The bit line contact hole 135 may be formed by etching an upper portion of the gate capping layer 125, the substrate 101, and the device separation region 110 using the buffer insulating layer 128 and the first conductive pattern 141 as etch masks. The bit line contact hole 135 may expose the first impurity region 105*a*.

A bit line contact pattern DC may be formed to fill the bit line contact hole 135. Forming the bit line contact pattern DC may include forming a conductive layer filling the bit line contact hole 135 and performing a planarization process. For example, the bit line contact pattern DC may be formed of polysilicon. After sequentially forming a second conductive pattern 142, a third conductive pattern 143, and first to third capping patterns 146, 147, and 148 on the first conductive pattern 141, the first to third conductive patterns 141, 142, and 143 may be sequentially etched using the three capping patterns 146, 147, and 148 as etch masks. As a result, the bit line structure BLS including the bit line BL including the first to third conductive patterns 141, 142, and 143 and the bit line capping pattern BC including the first to third capping patterns 146, 147, and 147 may be formed.

The spacer structures SS may be formed on side surfaces of the bit line structures BLS. The spacer structure SS may be formed of a plurality of layers. Fence insulating patterns 154 may be formed between the spacer structures SS. The fence insulating patterns 154 may include silicon nitride or silicon oxynitride. A first opening OP1 exposing the second impurity region 105*b* may be formed by performing an anisotropic etching process using the fence insulating patterns 154 and the third capping pattern 148 as etch masks.

Peripheral transistors may be formed in the peripheral circuit region PCR. The peripheral transistors may include a peripheral gate structure GS and peripheral source/drain regions 30. A peripheral gate spacer structure SS_P may be formed on a side surface of the peripheral gate structure GS. The peripheral gate structure GS may be formed in the same process step as that of the bit line BL, but the present inventive concept is not limited thereto. The insulating liner 152, the first interlayer insulating layer 156, and the second interlayer insulating layer 158 covering the peripheral transistors may be formed. Each of the insulating liner 152, the first interlayer insulating layer 156, and the second interlayer insulating layer 158 may include at least one of silicon oxide, silicon nitride, and silicon oxynitride.

Referring to FIGS. 1 and 9A to 9C, a lower conductive pattern 150 may be formed below the first opening OP1. The lower conductive pattern 150 may be formed of a semiconductor material such as polysilicon. For example, the lower conductive pattern 150 may be formed by forming a polysilicon layer filling the first opening OP1 and then performing an etch-back process.

A metal-semiconductor compound layer 155 may be formed on the lower conductive pattern 150. The formation of the metal-semiconductor compound layer 155 may include a metal layer deposition process and a heat treatment process.

A first contact hole OP2*a* exposing the word line WL may be formed to penetrate through the first and second interlayer insulating layers 156 and 158, the insulating liner 152, and the buffer insulating layer 128. A lower portion of the first contact hole OP2*a* may expose the word line WL. The first contact hole OP2*a* may be formed to overlap the end portion EP of the word line WL, and a process of removing a portion of the upper pattern 122 to expose the lower pattern 121 may be omitted. In order to increase an area in which the lower pattern 121 is exposed through the first contact hole OP2*a*, for example, a wet etching process may be further performed. In this step, contact portions including contact surfaces as in the embodiments of FIGS. 3A to 7 may be formed.

A second contact hole OP2*b* may be formed on the peripheral transistors to penetrate through the insulating liner 152 and the first and second interlayer insulating layers 156 and 158 to expose the peripheral source/drain regions 30. The first contact hole OP2*a* and the second contact hole OP2*b* may be formed through the same process step, that is, the same etching process.

Since the word line WL is embedded in the upper portion of the substrate 101, the first contact hole OP2*a* may be deeper than the second contact hole OP2*b*. Accordingly, when the second contact hole OP2*b* is formed, the upper portion of the substrate 101 may be excessively etched. To impede/prevent this, the process of forming the first and second contact holes OP2*a* and OP2*b* may be performed using an etching process having a relatively low etch rate with respect to a semiconductor material such as silicon. As a result, a problem that the second contact hole OP2*b* is formed to have an excessive depth, for example, deep enough to penetrate through the peripheral source/drain regions 30, in the upper portion of the substrate 101 may be solved, but the first contact hole OP2*a* may incompletely penetrate through the upper pattern 122 including the semiconductor material. As a result, the contact plug formed in the first contact hole OP2*a* may be incompletely connected to the lower pattern 121, thereby increasing electrical resistance or causing disconnection.

According to example embodiments, the first contact hole OP2*a* may be formed to overlap the end portion EP of the word line WL. In the process of forming the first contact hole OP2*a*, an etching rate of the second insulating liner 112 and the embedded insulating layer 113 is higher than that of the upper pattern 122, and accordingly, the first contact hole OP2*a* may include a portion protruding downwardly along the end surface ES of the word line WL. An etch depth of the first contact hole OP2*a* may be increased along the second insulating liner 112 and the embedded insulating layer 113. Also, a surface of the lower pattern 121 exposed through the first contact hole OP2*a* may be concavely recessed to increase a contact area between the first contact hole OP2*a* and the lower pattern 121. Accordingly, since the contact plug formed in the first contact hole OP2*a* may have a side surface convex toward the lower pattern 121, a contact area may increase and thus electrical resistance may decrease.

Referring back to FIGS. 1 and 2A to 2C, the barrier layer 162 and the conductive layer 164 may be sequentially deposited to form the contact plug 160*cp*1 in the first contact hole OP2*a*, and the peripheral contact plug 160*cp*2 may be formed in the second contact hole OP2*b*. The contact plug 160*cp*1 and the peripheral contact plug 160*cp*2 may be simultaneously formed. A first upper conductive pattern 160*c* may be formed in the first opening OP. The first upper conductive pattern 160*c* may be simultaneously formed with the second upper conductive pattern 160*p*1 and the third upper conductive pattern 160*p*2 in the peripheral circuit region PCR. Thereafter, a patterning process may be performed on the barrier layer 162 and the conductive layer 164 to form insulating patterns 165 penetrating therethrough. Thereafter, a capacitor structure including a lower electrode, a capacitor dielectric layer, and an upper electrode may be formed on the first upper conductive pattern 160*c*.

As set forth above, by optimizing the arrangement and shape of the contact plug connected to the gate electrode, a semiconductor device having improved electrical characteristics and reliability may be provided.

The various and beneficial advantages and effects of the present inventive concept are not limited to the above, and are more easily understood in the course of describing specific embodiments of the present inventive concept.

While example embodiments have been shown and described above, it will be apparent to those skilled in the art that modifications and variations could be made without departing from the scope of the present inventive concept as defined by the appended claims.

What is claimed is:

1. A semiconductor device, comprising:

a substrate having a cell array region, a peripheral circuit region, and a connection region between the cell array region and the peripheral circuit region;

a device separation region including a first device separation layer defining a cell active region on the cell array region, a second device separation layer defining a peripheral active region on the peripheral circuit region, and a third device separation layer defining an active dam on the connection region, on the substrate;

a gate structure including a gate electrode, the gate electrode crossing the cell active region on the cell array region, extending into the third device separation layer on the connection region, and having an end surface in the third device separation layer; and a gate contact plug electrically connected to the gate electrode on the connection region, wherein the third device separation layer includes a first insulating liner, a second insulating liner on the first insulating liner, and an embedded insulating layer on the second insulating liner, and wherein the gate contact plug includes a protrusion extending downwardly along the end surface of the gate electrode and between the end surface of the gate electrode and the second insulating liner.

2. The semiconductor device of claim 1, wherein the protrusion is in contact with an upper surface of the embedded insulating layer and with a side surface of the second insulating liner that faces the end surface of the gate electrode.

3. The semiconductor device of claim 1, wherein a recessed portion of the gate electrode is in contact with a first portion of a surface of the gate contact plug, wherein the protrusion of the gate contact plug comprises a second portion of the surface of the gate contact plug, and wherein the end surface of the gate electrode is in contact with the second portion of the surface of the gate contact plug.

4. The semiconductor device of claim 3, wherein the first contact portion of the surface of the gate contact plug includes a portion curved convexly toward the gate electrode.

5. The semiconductor device of claim 4, wherein the gate electrode includes a lower pattern and an upper pattern on the lower pattern, and wherein the first contact portion of the first portion of the surface of the gate contact plug is vertically overlapped by a lower surface of the upper pattern.

6. The semiconductor device of claim 3, wherein the first portion of the surface of the gate contact plug includes a wave pattern or a plurality of step portions.

7. The semiconductor device of claim 1, wherein the gate electrode includes a first side and an opposite second side that are connected to the end surface, and wherein the gate contact plug is in contact with the end surface, the first side, and the second side of the gate electrode.

8. The semiconductor device of claim 1, wherein the gate structure further includes a gate capping layer on the gate electrode, and wherein the gate contact plug extends through at least a portion of the gate capping layer.

9. The semiconductor device of claim 8, wherein a longest dimension of the active dam extends in a second direction, perpendicular to a first direction in which a longest dimension of the gate electrode extends, and is in contact with the third device separation layer, and wherein an upper surface of the active dam is coplanar with an upper surface of the gate capping layer.

10. The semiconductor device of claim 1, wherein the cell active region includes a first impurity region and a second impurity region, wherein the semiconductor device further comprises:

a bit line structure having a longest dimension thereof extending across the gate structure, the bit line structure electrically connected to the first impurity region of the cell active region;

a lower conductive pattern electrically connected to the second impurity region of the cell active region;

a first upper conductive pattern on the lower conductive pattern; and a second upper conductive pattern on the gate contact plug, and wherein an upper surface of the first upper conductive pattern and an upper surface of the second upper conductive pattern are coplanar.

11. The semiconductor device of claim 10, further comprising:

a peripheral contact plug electrically connected to the peripheral active region of the substrate on the peripheral circuit region; and a third upper conductive pattern on the peripheral contact plug, wherein the upper surface of the second upper conductive pattern and an upper surface of the third upper conductive pattern are coplanar.

* * * * *